United States Patent
Su et al.

(10) Patent No.: US 7,187,527 B2
(45) Date of Patent: Mar. 6, 2007

(54) ELECTROSTATIC DISCHARGE CONDUCTION DEVICE AND MIXED POWER INTEGRATED CIRCUITS USING SAME

(75) Inventors: Shin Su, Banchiau (TW); Chun-Hsiang Lai, Taichung (TW); Cha-Ling Lu, Hsinchu (TW); Yen-Hung Yeh, Yangmei Township, Taoyuan County (TW); Tao-Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 188 days.

(21) Appl. No.: 10/933,181

(22) Filed: Sep. 2, 2004

(65) Prior Publication Data

US 2006/0044718 A1 Mar. 2, 2006

(51) Int. Cl.
*H02H 9/00* (2006.01)
(52) U.S. Cl. .................................................... 361/56
(58) Field of Classification Search ................. 361/56; 257/629
See application file for complete search history.

(56) References Cited

U.S. PATENT DOCUMENTS

| | | | |
|---|---|---|---|
| 5,616,943 A * | 4/1997 | Nguyen et al. | 257/355 |
| 5,986,863 A * | 11/1999 | Oh | 361/56 |
| 6,002,568 A * | 12/1999 | Ker et al. | 361/111 |
| 6,075,686 A | 6/2000 | Ker | |
| 6,144,542 A * | 11/2000 | Ker et al. | 361/111 |
| 6,208,494 B1 | 3/2001 | Nakura et al. | |
| 6,576,958 B2 * | 6/2003 | Ker et al. | 257/355 |
| 6,724,592 B1 * | 4/2004 | Tong et al. | 361/56 |
| 6,858,902 B1 * | 2/2005 | Salling et al. | 257/360 |
| 2002/0186517 A1 * | 12/2002 | Liu et al. | 361/56 |
| 2003/0133237 A1 * | 7/2003 | Hung et al. | 361/56 |
| 2004/0052019 A1 | 3/2004 | Liu et al. | |
| 2004/0114287 A1 * | 6/2004 | Salling et al. | 361/56 |

* cited by examiner

*Primary Examiner*—Brian Sircus
*Assistant Examiner*—Ann T. Hoang
(74) *Attorney, Agent, or Firm*—Mark Haynes; Haynes Beffel & Wolfeld LLP

(57) ABSTRACT

A device for connection between supply buses in mixed power integrated circuits includes a diode in series with a transistor with an active p-ring in a semiconductor substrate. The active p-ring surrounds the source and drain of the transistor with a conductive region having the same conductivity type as the semiconductor substrate. A control circuit coupled to the p-ring applies a bias voltage in response to an ESD event affecting the first and second conductors. The bias voltage tends to inject carriers into the semiconductor substrate which enables discharge of the short voltage pulse via a parasitic SCR in the substrate from the anode of the diode to the source of the transistor.

26 Claims, 6 Drawing Sheets

US 7,187,527 B2

ELECTROSTATIC DISCHARGE CONDUCTION DEVICE AND MIXED POWER INTEGRATED CIRCUITS USING SAME

BACKGROUND OF THE INVENTION

1. Field of the Invention

The present invention relates to electrostatic discharge ESD conduction devices for mixed power integrated circuits, particularly for providing noise isolation and ESD conduction between power buses having similar voltage levels in such mixed power integrated circuits.

2. Description of Related Art

Mixed power integrated circuits are being developed for a wide variety of applications. Such integrated circuits include circuits that operate based on different power supply arrangements. Mixed power integrated circuits can be characterized as including multiple power domains, where a power domain comprises circuits coupled to a power supply bus network that is separated from the power supply bus networks of other domains. For example, integrated circuits having digital circuits and analog circuits often provide a digital domain having a digital power supply bus network with both digital power and digital ground buses coupled to the digital circuits, and an analog domain having an analog power supply bus network with both analog power and analog ground buses coupled to the analog circuits. Some mixed power integrated circuits include multiple digital domains, with or without an analog domain. Some mixed power integrated circuits include multiple analog domains, with or without a digital domain. The power supply bus networks for the independent domains are separated in order to avoid coupling of noise between the circuits in the separate domains, and to allow the magnitude of the power supply voltages to be varied amongst the circuits in the separate domains on the device.

FIG. 1 illustrates a prior art arrangement for a mixed power integrated circuit. In the arrangement shown in FIG. 1, an I/O pin 10 is coupled to an internal circuit 111 on the integrated circuit. Basic ESD protection for the pin 10 is provided with respect to a global power supply $V_{CCO}$ bus 12 by a diode 13, and with respect to a global ground $V_{SSO}$ bus 14 by a diode 15. The internal circuit 11 is coupled to local power supply $V_{CCI}$ bus 16 and to local ground $V_{SSI}$ bus 17. An ESD clamp 18 is coupled between the local power supply $V_{CCI}$ bus 16 and the local ground $V_{SSI}$ bus 17 which operates according to well-known principles to prevent the voltage difference between the two from exceeding a safe level during an ESD event. A diode 19, having its cathode coupled to the local power supply $V_{CCI}$ bus 16 and its anode to the local ground $V_{SSI}$ bus 17 provides protection from an ESD event which would cause the local ground $V_{SSI}$ bus 17 to exceed the voltage on the local power supply $V_{CCI}$ bus 16.

In the arrangement illustrated in FIG. 1, the global power supply $V_{CCO}$ bus 12 and the local power supply $V_{CCI}$ bus 16 are coupled together by an ESD conduction cell 21. Likewise the global ground $V_{SSO}$ bus 14 and the local ground $V_{SSI}$ bus 17 are coupled together by an ESD conduction cell 20. The ESD conduction cells are typically arranged as shown in FIG. 2 or FIG. 3 as pairs of counter parallel diode strings, which isolate the buses in the separate domains during normal operation, but allow conduction during an ESD event. Although this arrangement works suitably in some environments, a weakness is induced because of the finite resistance of the ESD conduction cells, symbolized by the resistor symbol within the block of ESD cell 20. Thus, the global ground $V_{SSO}$ bus 14 and the local ground $V_{SSI}$ bus 17 are separated such that this finite resistance affects the ESD conduction path. If an ESD pulse is applied to the pin 10, the ESD current is supposed to proceed along Path 1 through the ESD conduction cell 20 and the ESD power clamp 18, thereby protecting the internal circuit 11. However if the resistance in the ESD conduction cell 20 is too high, and the voltage difference caused is high enough to overstress and damage devices in the internal circuit 11, then the ESD current may discharge along Path 2, further damaging the device.

Thus, as can be seen, mixed power integrated circuits may lack sufficient ESD discharge paths in some configurations. It is desirable therefore to provide an ESD conduction device providing the needed noise isolation, and low resistance discharge during an ESD event, and to provide mixed power integrated circuits utilizing such devices.

SUMMARY OF THE INVENTION

The present invention provides a device which is normally rectifying, and highly conductive for short reverse bias voltage pulses, such as those which occur during an ESD event, suitable for use as an ESD conduction device between supply conductors in mixed power integrated circuits. Integrated circuits utilizing such devices are also provided.

An embodiment of the invention includes a device for connection between a first conductor and the second conductor. The device includes a diode having an anode and a cathode in a semiconductor substrate. The anode is coupled to the first conductor. A transistor having a source and a drain in the semiconductor substrate includes a gate coupled to its source and to the second conductor. An implant region in the semiconductor substrate is arranged to surround the source and drain of the transistor with a conductive region having the same conductivity type as the semiconductor substrate. A connector couples the cathode of the diode to the drain of the transistor. A control circuit is coupled to the implant region. The control circuit applies a bias voltage to the implant region in response to a short voltage pulse, such as an ESD event, affecting the first and second conductors. The bias voltage tends to inject carriers into the semiconductor substrate, which carriers enable discharge of the short voltage pulse via the substrate from the anode of the diode to the source of the transistor. According to an embodiment of the invention, semiconductor substrate comprises a p-type substrate, and implant region comprises a p-type implant. The diode in this embodiment comprises an n-type well in the semiconductor substrate having a p-type implant in the n-type well, arranged so that the p-type implant acts as the anode of the diode. The structure establishes a silicon controlled rectifier SCR in the substrate between the anode of the diode and the source of the transistor. The SCR is enabled by carriers injected into the substrate via the implant region by the control circuit.

The control circuit according to embodiments of the invention comprises a voltage selector which applies an output in response to a voltage on the first conductor or a voltage on the second conductor, whichever is higher. The output of the voltage selector is applied to a sensor, which senses the short voltage pulse on the output of the selector. The sensor generates a pulse in the bias voltage in response to the sensed short voltage pulse. The sensor for example comprises a high pass filter, such as a capacitor in series with a resistor coupled to a reference voltage. A buffer, such as an inverter string, generates the pulse in the bias voltage in response to short voltage pulses that appear at the output of the high pass filter. The high pass filter is configured to pass short voltage pulses such as occur during ESD events, while normal fluctuations in the voltage on the first and second conductors, including normal power-on fluctuations, are filtered out. Generally, the control circuit pulls the potential on the implant region to ground during normal operation to inhibit latch up, and injects current via the implant region into the substrate during an ESD event to lower the trigger voltage for conduction of current during the ESD event.

In some embodiments, an additional rectifier, such as a diode or another conduction device as just described, is arranged in a counter parallel fashion with the conduction device, for conduction of current in the opposite direction. Thus, when the additional rectifier comprises the simple diode, the anode of the diode is coupled to the second conductor, and a cathode of the diode is coupled to the first conductor.

As mentioned above, the first conductor and the second conductor according to embodiments of the invention comprise voltage supply bus conductors on an integrated circuit that are configured to carry voltages that are close in magnitude, such as nominally the same magnitude or having magnitudes that normally differ by less than a forward bias turn on voltage for a diode or diode string, and the conduction device is arranged for conduction during ESD events between the voltage supply bus conductors.

The invention is also embodied by an integrated circuit having multiple power domains formed on an semiconductor substrate. A first conductor on the semiconductor substrate is adapted for connection to a first power supply voltage for a first power domain, and a second conductor on the semiconductor search substrate is adapted for connection to a second power supply voltage for a second power domain. The conduction device, as described above, is connected between the first conductor and the second conductor for discharge of ESD events. The first power supply voltage in one implementation is a first positive voltage for a first power domain, and the second power supply voltage is a second positive voltage for a second power domain. In another implementation, the first power supply voltage is a ground reference voltage for a first power domain, and the second power supply voltage is a ground reference voltage for a second power domain on the integrated circuit.

Another configuration for an integrated circuit according to the present invention includes a common conductor adapted for conduction of ESD discharge current. A first conductor on the semiconductor substrate is adapted for connection to a first power supply voltage for a first power domain, and a second conductor on the semiconductor substrate is adapted for connection to a second power supply voltage for a second power domain. A first conduction device as described above, is coupled between the first conductor and the common conductor. A second conduction device as described above, is coupled between the second conductor and the common conductor. Thus, according to arrangements including a common conductor, a discharge path is established from a first conductor to the common conductor, and from the common conductor to the second conductor.

The conduction device in a basic configuration taught by the present invention comprises a diode in series with a NMOS transistor, having a p-type ring ("p-ring") surrounding the source and drain of the NMOS transistor, coupled as a conduction device between supply conductors. An SCR path in the substrate is enabled by a control circuit in response to an ESD event. During normal operation, the device does not conduct noise between the supply conductors, and allows only very low leakage current. During an ESD event, the SCR is triggered. The SCR establishes a low voltage drop path having a low holding voltage when conducting, providing for efficient discharge of the ESD event. In multi-power integrated circuits, the conduction device can be used to connect the power supply buses in the multiple power domains by highly conductive paths during an ESD event.

Other aspects and advantages of the present invention can be seen on review of the drawings, the detailed description and the claims, which follow.

DETAILED DESCRIPTION

A detailed description of embodiments of the present invention is provided with reference to the FIGS. 4–9.

Figure 1:
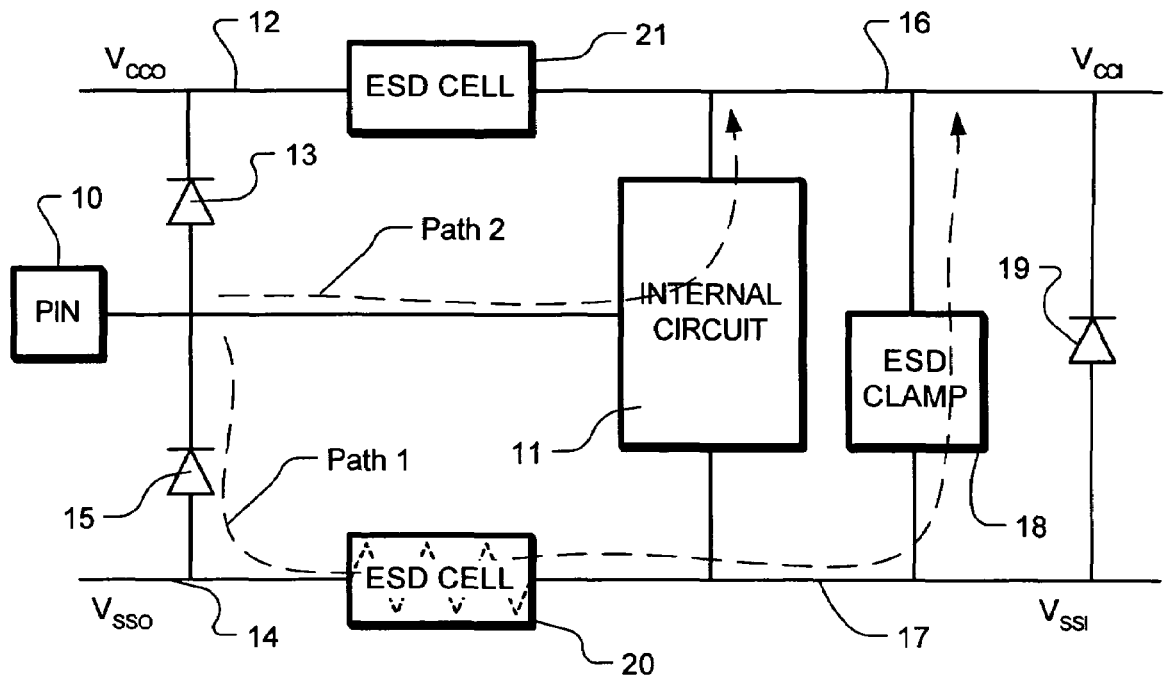
FIG. 1 is an illustration of a prior art arrangement for a multiple power domain integrated circuit.
Figure 2:
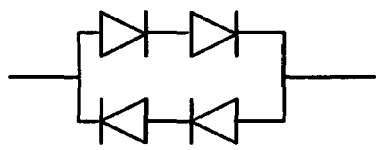
FIG. 2 illustrates a basic counter parallel diode string conduction device utilized in prior art arrangements as shown in FIG. 1.
Figure 3:
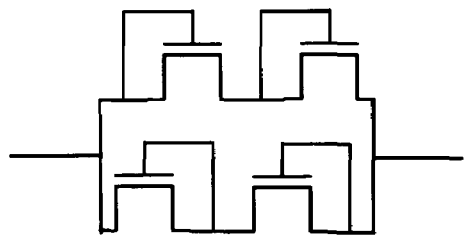
FIG. 3 illustrates a basic counter parallel diode string conduction device, based on diode configured MOS devices, utilized in prior art arrangements as shown in FIG. 1.
Figure 4:
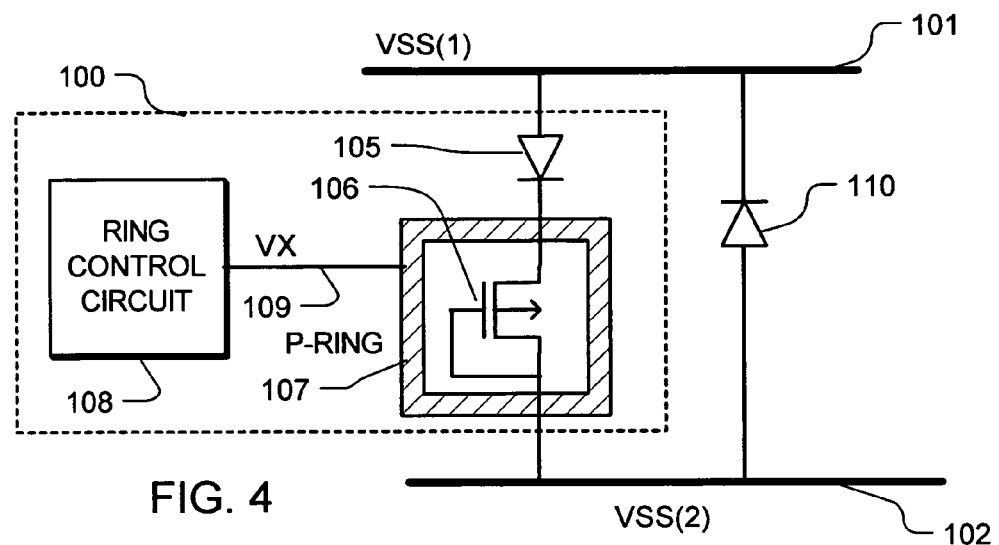
FIG. 4 illustrates a basic configuration of a conduction device according to an embodiment of the present invention.

FIG. 4 shows a conduction device 100 connected between a first conductor 101 and a second conductor 102, where the first conductor 101 and second conductor 102 are arranged to carry voltages that are close to one another. For example, the first conductor 101 and second conductor 102 comprise voltage supply buses for ground potentials VSS(1) and VSS(2) in the illustrated embodiment. In other examples, the first conductor 101 and second conductor 102 are voltage supply buses for the supply potentials VCC(1) and VCC(2) for separate power domains in an integrated circuit.

The conduction device includes a diode 105 and a transistor 106. The anode of the diode 105 is connected to the first conductor 101, and the cathode of the diode 105 is connected to the drain of the transistor 106. The gate and the source of the transistor 106 are connected to the second conductor 102. An implant region 107, referred to as a p-ring in FIG. 4, is arranged to surround the source and drain of the transistor 106. The implant region 107 has a p-type conductivity, which is the same as the p-type conductivity of the substrate in this embodiment. The transistor 106 for embodiments formed in a p-type substrate is an n-channel MOS type transistor. An SCR device (see FIG. 5) in the substrate between the anode of the diode 105 and the source of the transistor 106 results from the configuration of the diode 105, implant region 107 and transistor 106. A ring control circuit 108 provides a bias signal VX on line 109 to the implant region 107. The ring control circuit 108 is connected to the first conductor 101 and the second conductor 102 by connections not shown in FIG. 4. The bias signal VX is normally ground in this embodiment. In response to a short voltage pulse, such as generated during an ESD event, the ring control circuit 108 generates a short positive pulse injecting carriers into the substrate via the p-ring, lowering the trigger voltage of the SCR device between the anode of the diode 105 and the source of the transistor 106.

In some embodiments, a counter parallel rectifier, such as diode 110, is connected between the second conductor 102 and the first conductor 101. In the illustrated embodiment, the diode 110 has its anode coupled to the second conductor 102, and its cathode coupled to the first conductor 101. The counter parallel rectifier in cooperation with the conduction device 100 helps provide isolation between the first conductor 101 and the second conductor 102. In some embodiments, the counter parallel rectifier may not be necessary.

Figure 5:
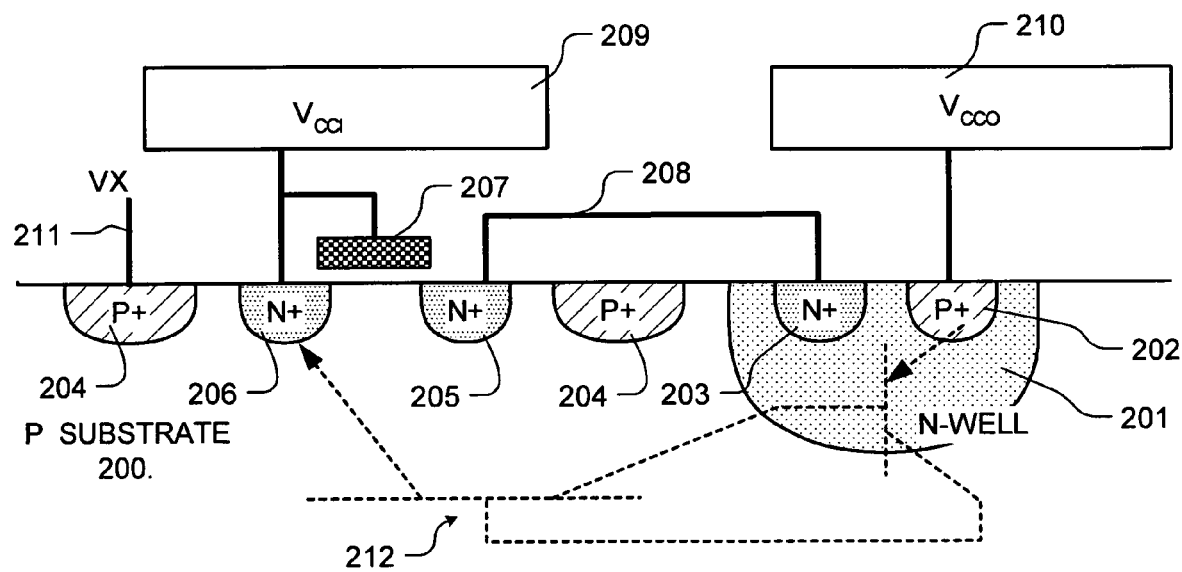
FIG. 5 shows a cross-sectional view of an implementation of a conduction device according to an embodiment of the present invention.

The structure of the diode 105, transistor 106 and implant region 107 of the conduction device 100 of FIG. 4 can be understood with reference to the cross-sectional diagram shown in FIG. 5. The device includes a p-type semiconductor substrate 200. A diode is formed in the p-type semiconductor substrate 200 by n-type well 201, with a p-type anode contact 202 formed in the n-type well 201. An n-type cathode contact 203 is included in the n-type well 201. An NMOS transistor includes an n-type drain region 205 and an n-type source region 206 in the semiconductor substrate 200. The transistor includes a gate 207 overlying a channel region between the source region 206 and drain region 205. A p-type implant region 204 is configured as a ring surrounding the n-type source and drain regions 205, 206. The cross-section shown in FIG. 5 intersects the p-type implant region 204 in two positions as can be seen. The n-type cathode contact 203 of the diode is connected by conductor 208 to the drain region 205 in the transistor. The conductor 208 is electrically isolated from the substrate 200 and the implant region 204. The gate 207 and the source 206 of the transistor are coupled to conductor 209. The anode contact 202 of the diode is coupled with the conductor 210. The implant region 204 is connected by conductor 211 to the bias voltage VX produced by a ring control circuit as described above.

An SCR structure 212, schematically represented by the dashed-line, pnp/npn transistor symbol in the substrate, is established between anode contact 202 of the diode and the source region 206 of the transistor. During normal operation, the diode and transistor are off, and essentially no current flows. During an ESD event, the bias voltage VX is pulsed positive, causing charge carriers to be injected into the substrate via the implant region 204, lowering the trigger voltage of the SCR structure 212 and causing a highly conductive path between the conductors 209 and 210.

In this example, the conductor 209 is an internal power supply bus carrying the supply voltage $V_{CCI}$. In this example, the conductor 210 is a global power supply bus carrying the global supply voltage $V_{CCO}$. The internal power supply voltage in this embodiment has essentially the same voltage level as the global power supply voltage. The conductors 209 and 210 are isolated by the conduction device to divide the power domains of the integrated circuit for noise protection and for other reasons known in the art.

In one embodiment, the transistor in the conduction device has a channel length (dimension parallel to the line of cross-section between source 206 and drain 205) on the order of 0.5 to 1.0 micron and a channel width (dimension perpendicular to the line of cross-section) on the order of 15 microns in a single finger configuration. The diode has similar dimensions. The power supply buses may be configured around the periphery of the integrated circuit, and the conduction device formed substantially underneath the power supply buses as suggested by the drawing in FIG. 5.

Figure 6:
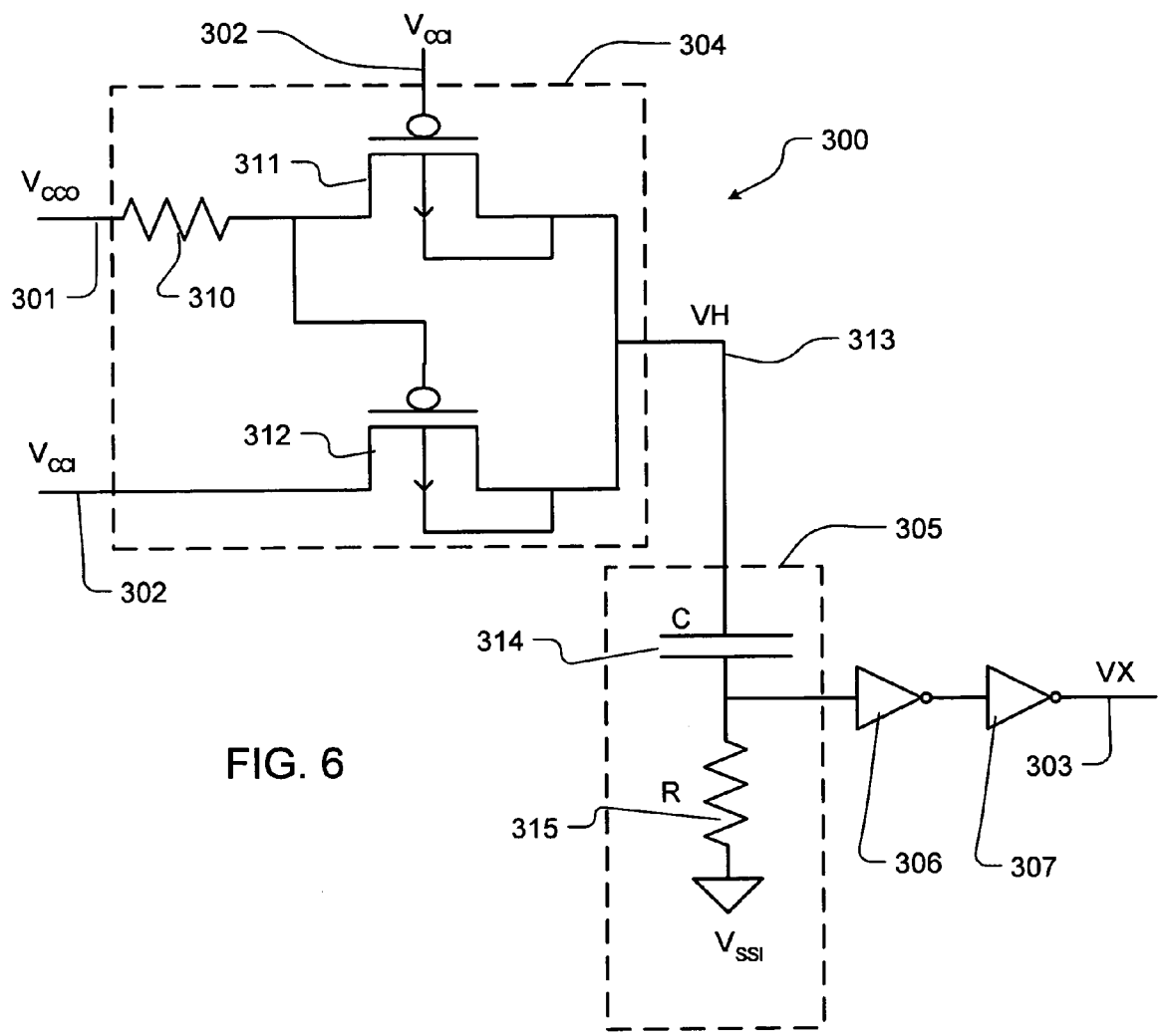
FIG. 6 is a schematic diagram of a ring control circuit suitable for use with an implementation of a conduction device like that of FIG. 4 and FIG. 5.

FIG. 6 is a schematic diagram of an embodiment of a ring control circuit 300 suitable for use with the conduction device described with respect to FIGS. 4 and 5. The ring control circuit 300 is coupled to the first conductor 301 carrying the supply voltage $V_{CCO}$ and the second conductor 302 carrying the supply voltage $V_{CCI}$. The ring control circuit 300 produces the bias voltage VX on line 303. The ring control circuit 300 includes a voltage selector 304, and a sensor that comprises a high pass filter 305 and a driver composed of series inverters 306 and 307 in this embodiment.

The voltage selector 304 includes a resistor 310 connected between the first conductor 301 and the drain of p-channel transistor 311, and between the first conductor 301 and the gate of p-channel transistor 312. The second conductor 302 is connected to the drain of transistor 312, and the gate of transistor 311. The source of the transistor 311 is coupled to its channel, and to the selector output terminal 313. The source of transistor 312 is coupled to its channel, and to the selector output terminal 313. The voltage VH on the output terminal 313 is derived from the one of the first conductor 301 and the second conductor 302 which has the highest voltage. The resistor 310 is utilized to favor the voltage on the second conductor 302 in this configuration so that the voltage on the output terminal 313 is stabilized during normal operation.

During an ESD event that affects one or the other of the conductors, a high voltage pulse VH is generated on the output terminal 313 of the voltage selector 304. A high voltage pulse VH is applied to a high pass filter 305 that comprises in this example a capacitor 314 in series with a resistor 315, between the output terminal 313 of the voltage selector 304, and ground. In this example, the ground node corresponds with the ground supply voltage $V_{SSI}$ for the power domain of the positive supply coupled to the conductor 302 of the voltage selector 304. The values of the capacitor 314 and the resistor 315 are selected to establish a cutoff frequency for sensing short voltage pulses on the supply conductors. For example, an ESD pulse can be detected with a time constant on the order of one microsecond, while adequately distinguishing between normal fluctuations on the power supply buses, such as during power on. The high pass filter 305 drives the first inverter 306 and the second inverter 307 to produce a pulse on the bias voltage VX on line 303. During a short pulse produced in response to an ESD event, VH will quickly rise with the ESD event. The node between the capacitor 314 and the resistor 315 will rise with VH, so long as the rise time is fast. As the node between the capacitor 314 and the resistor 315 reaches the trigger point of inverter 306, a low-going pulse is generated on its output. The low-going pulse on the output of inverter 306 produces a high-going pulse on the output of inverter 307 to provide enough drive power for the implant region of the conduction device. After the ESD event, the node between the capacitor 314 and the resistor 315 returns to ground, and the bias voltage VX on the output of inverter 307 driving implant region returns to ground in response.

Figure 7:
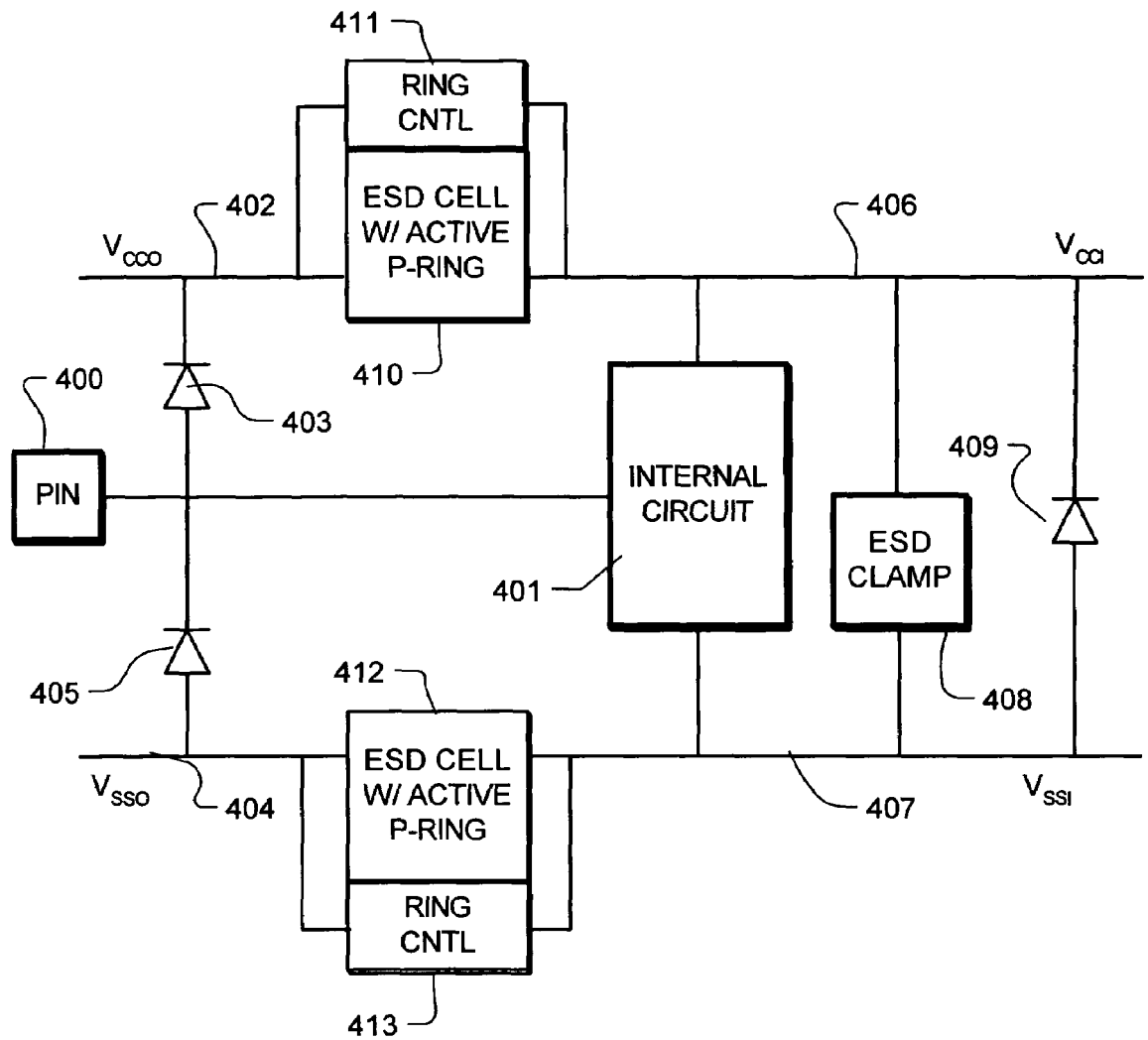
FIG. 7 illustrates an integrated circuit arrangement employing conduction devices like that shown in FIGS. 4–6, according to the present invention.

FIG. 7 illustrates a mixed power integrated circuit implemented according to the present invention. In the integrated circuit shown in FIG. 7, an I/O pin 400 is coupled to an internal circuit 401 on the integrated circuit. Basic ESD protection for the pin 400 is provided with respect to a global power supply $V_{CCO}$ bus 402 by a diode 403, and with respect to a global ground $V_{SSO}$ bus 404 by a diode 405. The internal circuit 401 is coupled to local power supply $V_{CCI}$ bus 406 and to local ground $V_{SSI}$ bus 407. An ESD clamp 408 is coupled between the local power supply $V_{CCI}$ bus 406 and the local ground $V_{SSI}$ bus 407 which operates according to well-known principles to prevent the voltage difference between the two from exceeding a safe level during an ESD event. A diode 409, having its cathode coupled to the local power supply $V_{CCI}$ bus 406, and its anode to the local ground $V_{SSI}$ bus 407, provides protection from an ESD event which would cause the local ground $V_{SSI}$ bus 407 to exceed the voltage on the local power supply $V_{CCI}$ bus 406. An ESD conduction cell 410 with an active p-ring and a ring control circuit 411 as described in detail above, are coupled between the global power supply $V_{CCO}$ bus 402 and the local power supply $V_{CCI}$ bus 406. An ESD conduction cell 412 with an active p-ring and a ring control circuit 413 as described in detail above, are coupled between the global ground $V_{SSO}$ bus 404 and the local ground $V_{SSI}$ bus 407.

Figure 8:
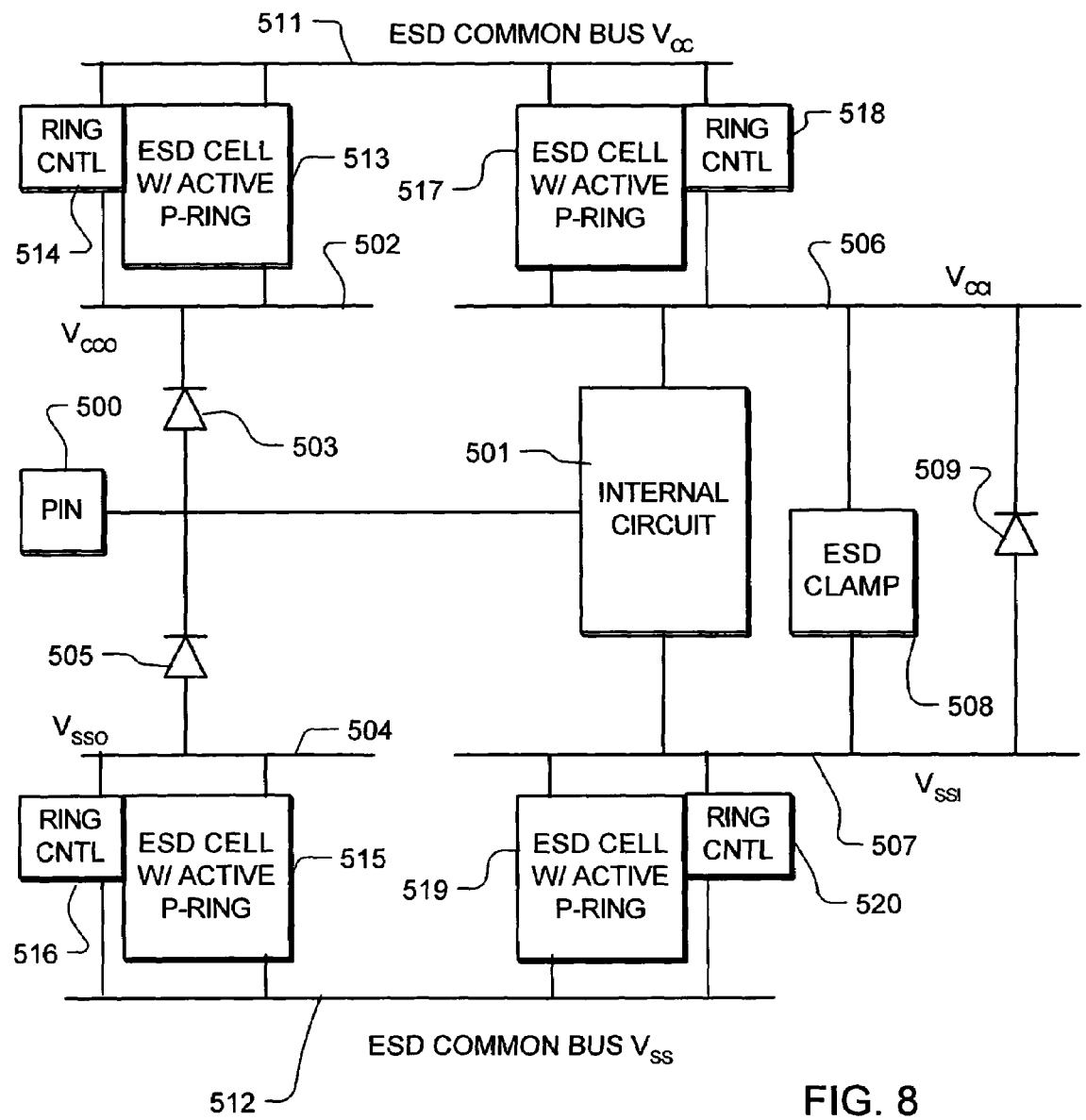
FIG. 8 illustrates another integrated circuit arrangement employing conduction devices like that shown in FIGS. 4–6, according to the present invention.

FIG. 8 illustrates another mixed power integrated circuit implemented according to the present invention. In the integrated circuit shown in FIG. 8, an I/O pin 500 is coupled to an internal circuit 501 on the integrated circuit. Basic ESD protection for the pin 500 is provided with respect to a global power supply $V_{CCO}$ bus 502 by a diode 503, and with respect to a global ground $V_{SSO}$ bus 504 by a diode 505. The internal circuit 501 is coupled to local power supply $V_{CCI}$ bus 506 and to local ground $V_{SSI}$ bus 507. An ESD clamp 508 is coupled between the local power supply $V_{CCI}$ bus 506 and the local ground $V_{SSI}$ bus 507 which operates according to well-known principles to prevent the voltage difference between the two from exceeding a safe level during an ESD event. A diode 509, having its cathode coupled to the local power supply $V_{CCI}$ bus 506 and its anode to the local ground $V_{SSI}$ bus 507 provides protection from an ESD event which would cause the local ground $V_{SSI}$ bus 507 to exceed the voltage on the local power supply $V_{CCI}$ bus 506. In this configuration, an ESD power supply $V_{CC}$ common bus 511 and an ESD ground supply $V_{SS}$ common bus 512 are included on the integrated circuit. The ESD common buses 511 and 512 are typically arranged around the periphery of the integrated circuit and provide a highly conductive path for discharging ESD current from internal buses off the chip. To provide efficient ESD discharge paths between the power supply domains on the integrated circuit, the global power supply $V_{CCO}$ bus 502 and the local power supply $V_{CCI}$ bus 506 are coupled to the ESD power supply $V_{CC}$ common bus 511 via ESD conduction cells. Likewise, the global ground $V_{SSO}$ bus 504 and the local ground $V_{SSI}$ bus 507 are coupled to the ESD ground supply $V_{SS}$ common bus 512 via ESD conduction cells. Thus, as illustrated in FIG. 8, an ESD conduction cell 513 with an active p-ring and a ring control circuit 514 as described in detail above, are coupled between the global power supply $V_{CCO}$ bus 502 and the ESD power supply $V_{CC}$ common bus 511. An ESD conduction cell 517 with an active p-ring and a ring control circuit 518 as described in detail above, are coupled between the local power supply $V_{CCI}$ bus 506 and the ESD power supply $V_{CC}$ common bus 511. An ESD conduction cell 515 with an active p-ring and ring control circuit 516 as described in detail above, are coupled between the global ground $V_{SSO}$ bus 504 and the ESD ground supply $V_{SS}$ common bus 512. An ESD conduction cell 519 with an active p-ring and ring control circuit 520 as described in detail above, are coupled between the local ground $V_{SSI}$ bus 507 and the ESD ground supply $V_{SS}$ common bus 512.

Figure 9:
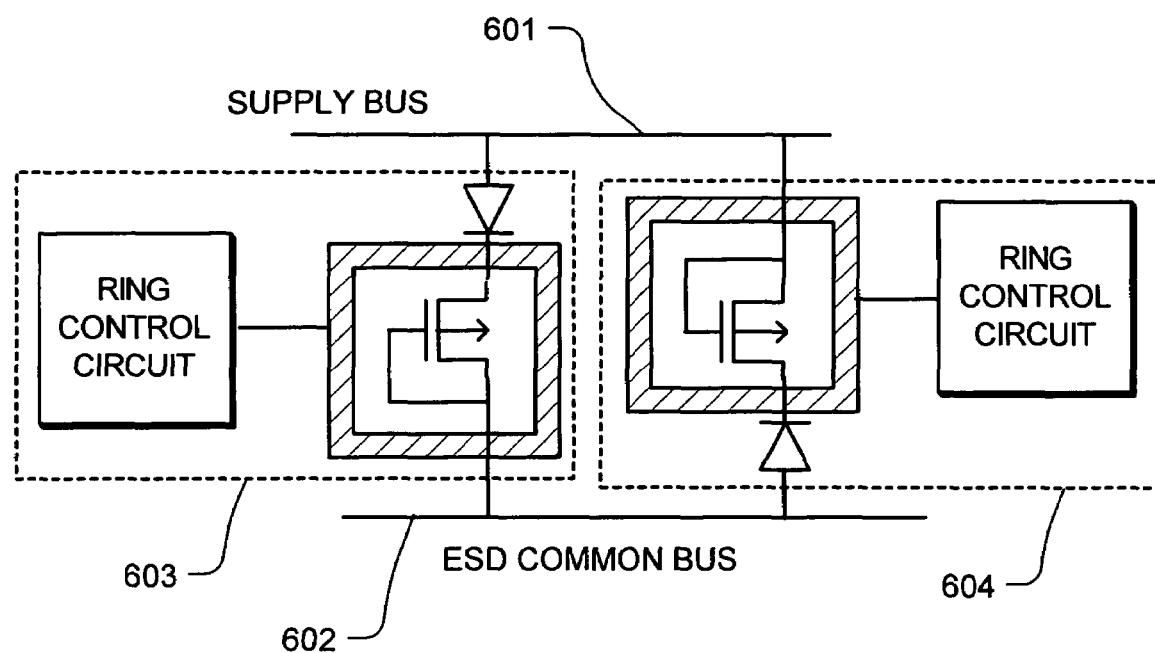
FIG. 9 illustrates another configuration of a conduction device according to an embodiment of the present invention, with counter parallel devices.

FIG. 9 illustrates a counter parallel configuration of ESD conduction cells 603 and 604 according to the present invention, between a first conductor 601 such as a ground or power supply bus, and a second conductor 602 such as an ESD common bus. In this example, the conduction cell 603 is arranged so that the anode of the diode of the conduction cell 603 is coupled to the first conductor 601, and the source of the transistor is coupled to the second conductor 602. A conduction cell 604 is arranged in counter parallel configuration, replacing the diode 110 of FIG. 4. Thus the anode of the diode of the conduction cell 604 is coupled to the second conductor 602 and the source of the transistor is coupled to the first conductor 601. The embodiment of FIG. 9 provides good ESD performance for both positive and negative going pulses. However, the embodiment of FIG. 9 requires significantly more space on the integrated circuit than that shown in FIG. 4.

In summary, an embodiment of an ESD conduction cell with an active p-ring and NMOS transistor is provided, along with power bus architectures deploying such ESD conduction cell for multi-power domain integrated circuits. Substantial improvements in ESD performance are achieved, enabling implementation of multi-power domain integrated circuits with power domains having sensitive devices. System-on-a-chip devices, mixed digital/analog devices, processor devices with embedded memory, and other integrated circuit devices are enabled by the present invention.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A device for connection between a first conductor and a second conductor, comprising:
    a diode having an anode and a cathode in a semiconductor substrate, the anode coupled to the first conductor;
    a transistor having a source and a drain in the semiconductor substrate, and having a gate coupled to the source and to the second conductor;
    an implant region in the semiconductor substrate, the implant region arranged to surround the source and the drain of the transistor and including a portion in a region in the substrate between the diode and the transistor;
    a connector electrically coupling the cathode of the diode to the drain of the transistor, and electrically isolated from the implant region; and
    a control circuit coupled to the implant region, the control circuit applying a bias voltage to the implant region in response to a voltage pulse affecting the first and second conductors, the bias voltage tending to inject carriers into the semiconductor substrate including into there region between the diode and the transistor, which enable discharge of the voltage pulse via the substrate.

2. The device of claim 1, wherein the semiconductor substrate comprises a p-type substrate, and the diode comprises an n-type well in the semiconductor substrate, having a p-type implant in the n-type well, the p-type implant acting as the anode.

3. The device of claim 1, wherein the semiconductor substrate comprises a p-type substrate, and the implant region comprises a p-type implant.

4. The device of claim 1, wherein the semiconductor substrate comprises a p-type substrate, the implant region comprises a p-type implant, and the diode comprises an n-type well in the semiconductor substrate, having a p-type implant in the n-type well arranged so that the p-type implant acts as the anode, and to establish a silicon controlled rectifier between the anode of the diode and the source of the transistor which is enabled by the injected carriers.

5. The device of claim 1, wherein the control circuit comprises a voltage selector applying an output in response to a voltage on the first conductor or a voltage on the second conductor, whichever is higher, and a sensor which senses a voltage pulse on the output and generates a pulse in the bias voltage in response to a sensed voltage pulse.

6. The device of claim 1, including a diode having an anode coupled to the second conductor and a cathode coupled to the first conductor.

7. The device of claim 1, including:
an additional diode having an anode and a cathode in the semiconductor substrate, the anode coupled to the second conductor;
an additional transistor having a source and a drain in the semiconductor substrate, and having a gate coupled to the source and to the first conductor;
an additional implant region in the semiconductor substrate, the additional implant region arranged to surround the source and the drain of the additional transistor and including a portion in a region in the substrate between the additional diode and the additional transistor;
an additional connector electrically coupling the cathode of the additional diode to the drain of the additional transistor, and electrically isolated from the additional implant region; and
an additional control circuit coupled to the additional implant region, the additional control circuit applying a bias voltage to the additional implant region in response to a voltage pulse affecting the first and second conductors, the bias voltage tending to inject carriers into the semiconductor substrate including into the region between the additional diode and the additional transistor, which enable discharge of the voltage pulse via the substrate.

8. An integrated circuit having multiple power domains, the integrated circuit formed on a semiconductor substrate, and comprising:
a first conductor on the semiconductor substrate adapted for connection to a first power supply voltage for a first power domain and a second conductor on the semiconductor substrate adapted for connection to a second power supply voltage for a second power domain; and
an electrostatic discharge conduction device for connection between a first conductor and a second conductor, the conduction device comprising
a diode having an anode and a cathode in a semiconductor substrate, the anode coupled to the first conductor;
a transistor having a source and a drain in the semiconductor substrate, and having a gate coupled to the source and to the second conductor;
an implant region in the semiconductor substrate, the implant region arranged to surround the source and the drain of the transistor and including a portion in a region in the substrate between the diode and the transistor;
a connector electrically coupling the cathode of the diode to the drain of the transistor, and electrically isolated from the implant region; and
a control circuit coupled to the implant region, the control circuit applying a bias voltage to the implant region in response to an electrostatic discharge event affecting the first and second conductors, the bias voltage tending to inject carriers into the semiconductor substrate including into the region between the diode and the transistor, which enable discharge of the electrostatic discharge event via the substrate.

9. The integrated circuit of claim 8, wherein the semiconductor substrate comprises a p-type substrate, and the diode comprises an n-type well in the semiconductor substrate, having a p-type implant in the n-type well the p-type implant acting as the anode.

10. The integrated circuit of claim 8, wherein the semiconductor substrate comprises a p-type substrate, and the implant region comprises a p-type implant.

11. The integrated circuit of claim 8, wherein the semiconductor substrate comprises a p-type substrate, the implant region comprises a p-type implant, and the diode comprises an n-type well in the semiconductor substrate, having a p-type implant in the n-type well arranged so that the p-type implant acts as the anode, and to establish a silicon controlled rectifier between the anode of the diode and the source of the transistor which is enabled by the injected carriers.

12. The integrated circuit of claim 8, wherein the control circuit comprises a voltage selector applying an output in response to a voltage on the first conductor or a voltage on the second conductor, whichever is higher, and a sensor which senses an electrostatic discharge event on the output and generates a pulse in the bias voltage in response to a sensed electrostatic discharge event.

13. The integrated circuit of claim 8, including a diode having an anode coupled to the second conductor and a cathode coupled to the first conductor.

14. The integrated circuit of claim 8, including:
an additional diode having an anode and a cathode in the semiconductor substrate, the anode coupled to the second conductor;
an additional transistor having a source and a drain in the semiconductor substrate, and having a gate coupled to the source and to the first conductor;
an additional implant region in the semiconductor substrate, the additional implant region arranged to surround the source and the drain of the additional transistor and including a portion in a region in the substrate between the additional diode and the additional transistor;
an additional connector electrically coupling the cathode of the additional diode to the drain of the additional transistor, and electrically isolated from the additional implant region; and an additional control circuit coupled to the additional implant region, the additional control circuit applying a bias voltage to the additional implant region in response to an electrostatic disehar e event affecting the first and second conductors, the bias voltage tending to inject carriers into the semiconductor substrate including into the region between the addition diode and the additional transistor, which enable discharge of the electrostatic discharge event via the substrate.

15. The integrated circuit of claim 8, wherein said first power supply voltage is a first positive voltage for a first power domain and the second power supply voltage is a second positive voltage for a second power domain.

16. The integrated circuit of claim 8, wherein said first power supply voltage is a first ground reference voltage for a first power domain and the second power supply voltage is a second ground reference voltage for a second power domain.

17. An integrated circuit having multiple power domains, the integrated circuit formed on a semiconductor substrate, and comprising:
   a common conductor adapted for conduction of electrostatic discharge current;
   a first conductor on the semiconductor substrate adapted for connection to a first power supply voltage for a first power domain and a second conductor on the semiconductor substrate adapted for connection to a second power supply voltage for a second power domain;
   a first electrostatic discharge conduction device for connection between the first conductor and the common conductor, the conduction device comprising
      a diode having an anode and a cathode in a semiconductor substrate, the anode coupled to the first conductor;
      a transistor having a source and a drain in the semiconductor substrate, and having a gate coupled to the source and to the common conductor;
      an implant region in the semiconductor substrate, the implant region arranged to surround the source and the drain of the transistor and including a portion in a region in the substrate between the diode and the transistor;
      a connector electrically coupling the cathode of the diode to the drain of the transistor, and electrically isolated from the implant region; and
      a control circuit coupled to the implant region, the control circuit applying a bias voltage to the implant region in response to an electrostatic discharge event affecting the first conductor, the bias voltage tending to inject carriers into the semiconductor semiconductor substate including into the region between the diode and the transistor, which enable discharge of the electrostatic discharge event via the substrate; and
   a second electrostatic discharge conduction device for connection between the second conductor and the common conductor, the conduction device comprising
      a diode having an anode and a cathode in the semiconductor substrate, the anode coupled to the second conductor;
      a transistor having a source and a drain in the semiconductor substrate, and having a gate coupled to the source and to the common conductor;
      an implant region in the semiconductor substrate, the implant region arranged to surround the source and the drain of the transistor and including a portion in a region in the substrate between the diode and the transistor;
      a connector electrically coupling the cathode of the diode to the drain of the transistor, and electrically isolated from the implant region; and
      a control circuit coupled to the implant region, the control circuit applying a bias voltage to the implant region in response to an electrostatic discharge event affecting the first conductor, the bias voltage tending to inject carriers into the semiconductor substrate including into the region between the diode and the transistor, which enable discharge of the electrostatic discharge event via the substrate.

18. The integrated circuit of claim 17, wherein the semiconductor substrate comprises a p-type substrate, and the diodes in the first electrostatic discharge conduction device and in the second electrostatic discharge conduction device respectively comprise an n-type well in the semiconductor substrate, having a p-type implant in the n-type well the p-type implant acting as the anode.

19. The integrated circuit of claim 17, wherein the semiconductor substrate comprises a p-type substrate, and the implant regions in the first electrostatic discharge conduction device and in the second electrostatic discharge conduction device respectively comprise a p-type implant.

20. The integrated circuit of claim 17, wherein the semiconductor substrate comprises a p-type substrate, and in at least one of the first and second electrostatic discharge conduction devices the implant region comprises a p-type implant, and the diode comprises an n-type well in the semiconductor substrate, having a p-type implant in the n-type well arranged so that the p-type implant acts as the anode, and to establish a silicon controlled rectifier between the anode of the diode and the source of the transistor which is enabled by the injected carriers.

21. The integrated circuit of claim 17, wherein, in at least one of the first and second electrostatic discharge conduction devices, the control circuit comprises a voltage selector applying an output in response to a voltage on the first conductor or a voltage on the second conductor, whichever is higher, and a sensor which senses an electrostatic discharge event on the output and generates a pulse in the bias voltage in response to a sensed event.

22. The integrated circuit of claim 17, including a diode in the first electrostatic discharge conduction device, the diode having an anode coupled to the common conductor and a cathode coupled to the first conductor.

23. The integrated circuit of claim 17, including a diode in the second electrostatic disehar e conduction device, the diode having an anode coupled to the common conductor and a cathode coupled to the second conductor.

24. The integrated circuit of claim 17, including in the first electrostatic discharge conduction device:
   an additional diode having an anode and a cathode in the semiconductor substrate, the anode coupled to the common conductor;
   an additional transistor having a source and a drain in the semiconductor substrate, and having a gate coupled to the source and to the first conductor;
   an additional implant region in the semiconductor substrate, the additional implant region arranged to surround the source and the drain of the additional transistor and including a portion in a region in the substrate between the diode and the transistor;
   an additional connector electrically coupling the cathode of the additional diode to the drain of the additional transistor, and electrically isolated from the additional implant region; and
   an additional control circuit coupled to the additional implant region, the additional control circuit applying a bias voltage to the additional implant region in response to an electrostatic discharge event affecting the first and common conductors, the bias voltage tending to inject carriers into the semiconductor substrate, including into the region between the diode and the transistor, which enable discharge of the electrostatic discharge event via the substrate.

25. The integrated circuit of claim 17, wherein said first power supply voltage is a first positive voltage for a first power domain and the second power supply voltage is a second positive voltage for a second power domain.

26. The integrated circuit of claim 17, wherein said first power supply voltage is a first ground reference voltage for a first power domain and the second power supply voltage is a second ground reference voltage for a second power domain.

* * * * *

UNITED STATES PATENT AND TRADEMARK OFFICE
CERTIFICATE OF CORRECTION

PATENT NO. : 7,187,527 B2
APPLICATION NO. : 10/933181
DATED : March 6, 2007
INVENTOR(S) : Shin Su et al.

It is certified that error appears in the above-identified patent and that said Letters Patent is hereby corrected as shown below:

In claim 1, column 8, line 64, replace the word "there" with -- the --.

In claim 14, column 10, line 64, replace the phrase "disehar e" with -- discharge --.

In claim 14, column 10, line 67, replace the word "addition" with -- additional --.

In claim 21, column 12, line 36, after the word "sensed" please insert -- electrostatic discharge --.

In claim 23, column 12, line 41, replace the phrase "disehar e" with -- discharge --.

Signed and Sealed this

Eighteenth Day of September, 2007

JON W. DUDAS
*Director of the United States Patent and Trademark Office*